United States Patent
Murakami

(10) Patent No.: US 8,791,756 B2
(45) Date of Patent: Jul. 29, 2014

(54) AMPLIFYING CIRCUIT AND WIRELESS COMMUNICATIONS APPARATUS INCLUDING THE SAME

(75) Inventor: Tadamasa Murakami, Yokohama (JP)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 86 days.

(21) Appl. No.: 13/610,584

(22) Filed: Sep. 11, 2012

(65) Prior Publication Data

US 2013/0128779 A1 May 23, 2013

(30) Foreign Application Priority Data

Nov. 21, 2011 (JP) ................................. 2011-254075

(51) Int. Cl.
*H03F 1/14* (2006.01)

(52) U.S. Cl.
USPC .............................................. 330/51; 330/311

(58) Field of Classification Search
USPC ..................... 330/51, 311, 285, 296
See application file for complete search history.

(56) References Cited

U.S. PATENT DOCUMENTS

| | | | |
|---|---|---|---|
| 6,111,459 A | 8/2000 | Nishijima et al. | |
| 7,154,332 B2 * | 12/2006 | Tsuchi | 330/255 |
| 7,420,425 B2 * | 9/2008 | Tsai | 330/311 |
| 2008/0224770 A1 * | 9/2008 | Kim et al. | 330/51 |
| 2013/0088473 A1 * | 4/2013 | Tsuchi | 345/211 |

FOREIGN PATENT DOCUMENTS

| | | |
|---|---|---|
| JP | 07-202789 A | 8/1995 |
| JP | 2008-295088 A | 12/2008 |

OTHER PUBLICATIONS

Japanese Office Action issued in Japanese Application No. 2011-254075 dated Feb. 4, 2014, w/English translation.

* cited by examiner

*Primary Examiner* — Henry Choe
(74) *Attorney, Agent, or Firm* — McDermott Will & Emery LLP

(57) ABSTRACT

The amplifying circuit includes: an input transistor having a gate electrode connected to a signal input terminal inputting a wireless signal, a drain electrode connected to a power supply terminal, and a source electrode connected to a ground terminal; a first switch installed between the signal input terminal and the gate electrode; and a second switch installed between the power supply terminal and the drain electrode, wherein the input transistor has a predetermined bias voltage applied to the gate electrode thereof to simultaneously turn the first and second switches on during reception of the wireless signal and simultaneously turn the first and second switches off while applying the predetermined bias voltage to the gate electrode during transmission of the wireless signal.

4 Claims, 3 Drawing Sheets

AMPLIFYING CIRCUIT AND WIRELESS COMMUNICATIONS APPARATUS INCLUDING THE SAME

CROSS-REFERENCE TO RELATED APPLICATIONS

This application claims the priority of Japanese Patent Application No. 2011-254075 filed on Nov. 21, 2011, in the Korean Intellectual Property Office, the disclosure of which is incorporated herein by reference.

BACKGROUND OF THE INVENTION

1. Field of the Invention

The present invention relates to an amplifying circuit and a wireless communications apparatus including the same.

2. Description of the Related Art

In a wireless communications system such as a mobile phone or a wireless data communications apparatus, an amplifying circuit for amplifying a received signal is installed on a signal-receiving side. A low noise amplifier (LNA) may be provided as an example of an amplifying circuit. An LNA is a circuit amplifying a signal by reducing noise generated in the circuit itself to the lowest possible level thereof, and thus is an essential circuit disposed at a front end of a wireless receiving circuit (please see Patent Document 1).

In the case of implementing an LNA using a complementary metal oxide semiconductor (CMOS), manufacturing costs of the LNA may be reduced. Therefore, demand for this scheme has increased. In addition, owing to the original role of an LNA, an LNA is required to constantly have a high degree of linearity so as to reduce a noise figure (NF) and remove an interference wave.

Meanwhile, in the case in which a CMOS LNA circuit is used for, for example, time division duplexing (TDD), it is necessary to block current from flowing to the CMOS LNA circuit while the CMOS LNA circuit is not operating during a transmission due to the requirement for a reduction in power consumption.

According to the related art, in order to block current from flowing to the single ended CMOS LNA circuit while the CMOS LNA circuit is not operating, a gate bias voltage of an input transistor of the LNA circuit (for example, a ground potential) is equalized with a source voltage at a bias circuit side.

However, the LNA circuit generally has large resistance and capacitance components present therein, due to a resistor connected between the gate voltage and a node of the bias circuit. In addition, a certain period of time, according to a time constant defined by the resistance and capacitance components, is required to change the gate bias voltage.

In the case in which the CMOS LNA circuit is used for time division duplexing, a problem in which the change of the gate bias voltage fails to be matched to a switching time of transmission and reception, may occur. In order to solve such a problem, a method of installing a switch at a front end of the input transistor of the LNA circuit has also been considered. However, in the case in which a switch is installed at the front end of the input transistor of the LNA circuit, there is a risk that the NF of the LNA will increase.

RELATED ART DOCUMENT (Patent Document 1) Japanese Patent Laid-open Publication No. 2008-295088

SUMMARY OF THE INVENTION

An aspect of the present invention provides an amplifying circuit capable of being configured to block current from flowing to a complementary metal oxide semiconductor low noise amplifier (CMOS LNA) circuit while the CMOS LNA circuit is not operating, without increasing a noise figure (NF), and a wireless communications apparatus including the same.

According to an aspect of the present invention, there is provided an amplifying circuit including: an input transistor having a gate electrode connected to a signal input terminal inputting a wireless signal received therein, a drain electrode connected to a power supply terminal, and a source electrode connected to a ground terminal; a first switch installed between the signal input terminal and the gate electrode of the input transistor; and a second switch installed between the power supply terminal and the drain electrode of the input transistor, wherein the input transistor has a predetermined bias voltage applied to the gate electrode thereof to simultaneously turn the first and second switches on during reception of the wireless signal and simultaneously turn the first and second switches off while applying the predetermined bias voltage to the gate electrode of the input transistor during transmission of the wireless signal.

According to this configuration, the input transistor may have the gate electrode connected to the signal input terminal inputting the received wireless signal, the drain electrode connected to the power supply terminal, and the source electrode connected to the ground terminal, the first switch may be installed between the signal input terminal and the gate electrode of the input transistor, and the second switch may be installed between the power supply terminal and the drain electrode of the input transistor. The input transistor may have the predetermined bias voltage applied to the gate electrode thereof to simultaneously turn the first and second switches on during the reception of the wireless signal and simultaneously turn the first and second switches off while applying the predetermined bias voltage to the gate electrode of the input transistor during the transmission of the wireless signal. According to this configuration, current may not flow to the amplifying circuit during non-operation of the amplifying circuit without increasing a noise figure (NF).

The wireless signal may be transceived by time division duplexing.

According to another aspect of the present invention, there is provided a wireless communications apparatus including the amplifying circuit as described above.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
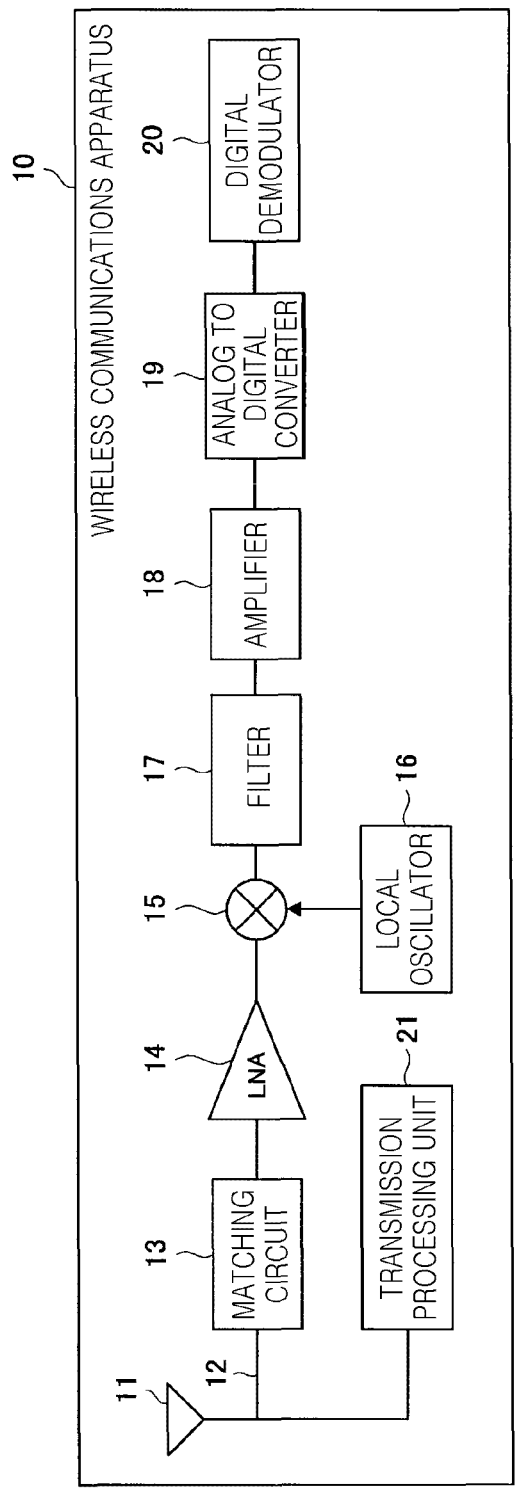
FIG. 1 is a block diagram showing a configuration of a wireless communications apparatus according to an embodiment of the present invention.

Hereinafter, embodiments of the present invention will be described in detail with reference to the accompanying drawings. In addition, throughout the present specification and the accompanying drawings, components having the same function will be denoted by the same reference numerals and an overlapped description will be omitted.

1. Embodiment of the Present Invention

Configuration of Wireless Communications Apparatus

First, a configuration of a wireless communications apparatus according to an embodiment of the present invention will be described. FIG. 1 is a block diagram showing a configuration of a wireless communications apparatus 10 according to an embodiment of the present invention. Hereinafter, the configuration of the wireless communications apparatus 10 according to the embodiment of the present invention will be described with reference to FIG. 1.

As shown in FIG. 1, the wireless communications apparatus 10 according to the embodiment of the present invention may include an antenna 11, a transmission path 12, an impedance matching circuit 13, a low noise amplifier (LNA) 14, a mixer 15, a local oscillator 16, a filter 17, an amplifier 18, an analog to digital converter (ADC) 19, a digital demodulator 20, and a transmission processing unit 21.

The antenna 11 may transceive radio waves. According to the present embodiment, the wireless communications apparatus 10 may transceive a high frequency signal in the GHz band, particularly, a high frequency signal in the 5 GHz band. The high frequency signal received in the antenna 11 may be transmitted to the impedance matching circuit 13 via the transmission path 12.

The impedance matching circuit 13 may be a circuit performing impedance matching so that reflection of the high frequency signal into the transmission path is significantly reduced. The high frequency signal received in the antenna 11 may be transmitted to the impedance matching circuit 13 via the transmission path 12 and may then be transmitted to the LNA 14.

The LNA 14 may amplify the high frequency signal transmitted by the impedance matching circuit 13. As described above, the LNA 14 may be a circuit amplifying a signal by reducing noise generated in the circuit itself to the lowest possible level thereof. Further, the LNA 14 according to the present embodiment may be implemented by a complementary metal oxide semiconductor (CMOS). The high frequency signal amplified by the LNA 14 may be transmitted to the mixer 15.

The mixer 15 may multiply the high frequency signal amplified by the LNA 14 by a high frequency signal output from the local oscillator 16. The mixer 15 multiplies the high frequency signal amplified by the LNA 14 by the high frequency signal output from the local oscillator 16, such that the high frequency signal in the GHz band may be converted into a signal in the MHz band. The mixer 15 may output the MHz band signal to the filter 17.

The local oscillator 16 may output the high frequency signal having a predetermined frequency. The high frequency signal output from the local oscillator 16 may be transmitted to the mixer 15. As described above, the mixer 15 multiplies the high frequency signal amplified by the LNA 14 by the high frequency signal output from the local oscillator 16, such that the GHz band high frequency signal may be converted into the MHz band signal.

The filter 17 may only allow a signal within a predetermined frequency region, among the signals output from the mixer 15, to pass therethrough. The signal passing through the filter 17 may be transmitted to the amplifier 18. The amplifier 18 may amplify the signal passing through the filter 17. The signal amplified by the amplifier 18 may be transmitted to the ADC 19.

The ADC 19 may convert an analog signal transmitted from the amplifier 18 into a digital signal. The digital signal converted by the ADC 19 may be transmitted to the digital demodulator 20. The digital demodulator 20 may demodulate the digital signal converted by the ADC 19. The digital demodulator 20 demodulates the digital signal, whereby the wireless communications apparatus 10 may recognize a content of the received high frequency signal.

The transmission processing unit 21 may perform various processing processes for transmitting a wireless signal from the antenna 11. The various processing processes performed by the transmission processing unit 21 may include, for example, modulation of the signal, amplification of the signal, and the like. The signal processed by the transmission processing unit 21 through various processing processes may be transmitted from the antenna 11.

Herein, the configuration of the wireless communications apparatus 10 according to the embodiment of the present invention has been described with reference to FIG. 1. Next, a configuration of the low noise amplifier (LNA) 14 included in the wireless communications apparatus 10 according to the embodiment of the present invention will be described.

Configuration of LNA

Figure 2:
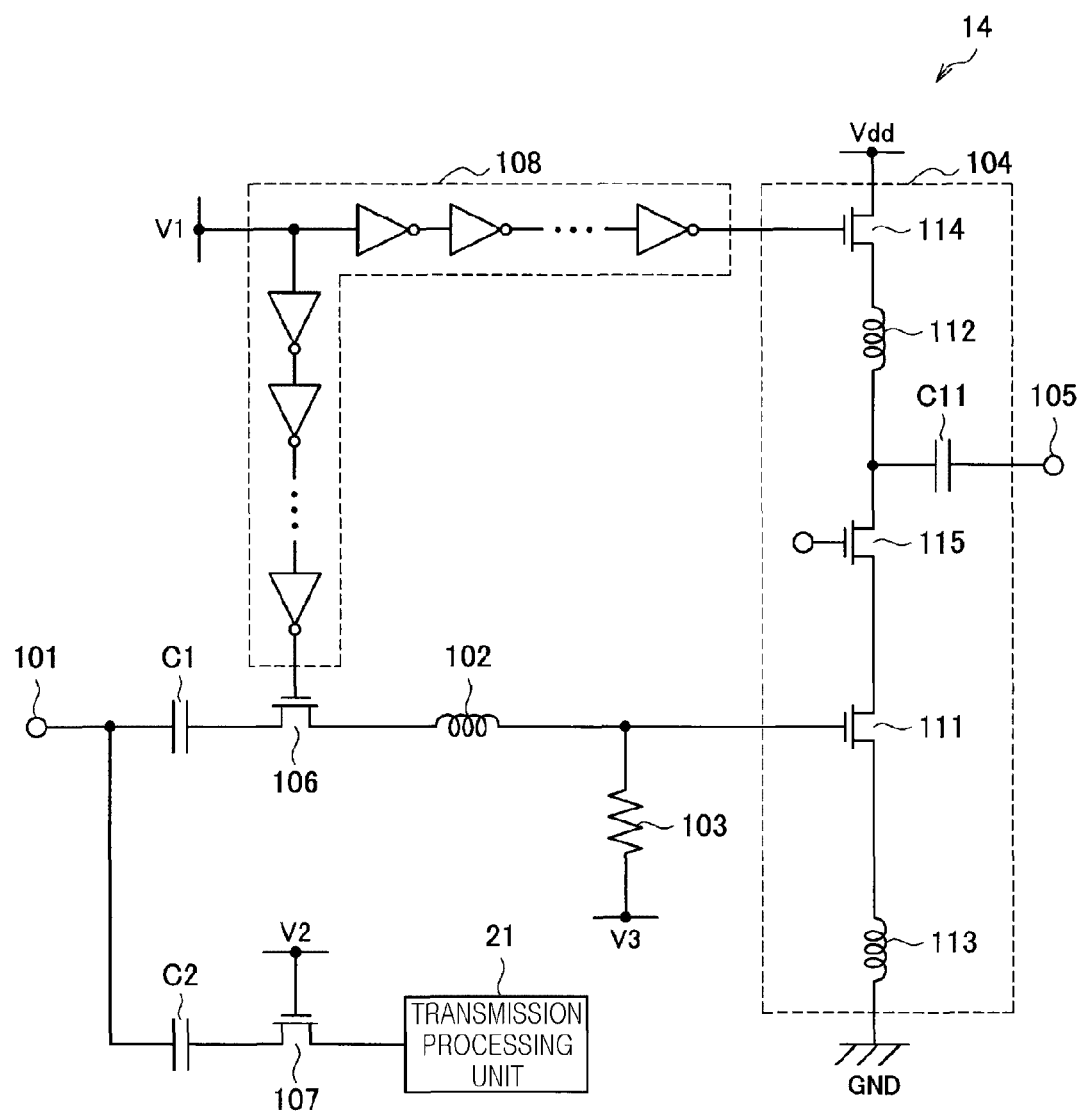
FIG. 2 is a circuit diagram showing a configuration of a low noise amplifier (LNA) included in the wireless communications apparatus according to the embodiment of the present invention.

FIG. 2 is a circuit diagram showing a configuration of the LNA included in the wireless communications apparatus according to the embodiment of the present invention. Hereinafter, the configuration of the LNA 14 included in the wireless communications apparatus 10 according to the embodiment of the present invention will be described with reference to FIG. 2.

As shown in FIG. 2, the LNA 14 included in the wireless communications apparatus 10 according to the embodiment of the present invention may include an input terminal 101, an inductor 102, a resistor 103, an amplifying circuit 104, an output terminal 105, a metal oxide semiconductor (MOS) transistor switch 106, a driver circuit 108, and a capacitor C1. The amplifying circuit 104 may include an N-channel metal oxide semiconductor field effect transistor (MOSFET) 111, inductors 112 and 113, MOS transistor switches 114 and 115, and a capacitor C11.

In addition, a MOS transistor switch 107 and a capacitor C2 are also shown in FIG. 2 although they are not included in the LNA 14.

The input terminal 101 may be a terminal at which the high frequency signal transmitted by the impedance matching circuit 13 arrives. The input terminal 101 may be connected to a gate of the N-channel MOSFET 111 included in the amplifying circuit 104 through the inductor 102.

The resistor 103 may be installed between the gate of the N-channel MOSFET 111 and a bias power supply V3. A predetermined bias voltage Vin may be applied to the gate of the N-channel MOSFET 111.

The amplifying circuit 104 may amplify the high frequency signal received in the input terminal 101 and then output the amplified high frequency signal to the output terminal 105. As described above, the amplifying circuit 104 may include the N-channel MOSFET 111, the inductors 112 and 113, the MOS transistor switches 114 and 115, and the capacitor C11. As shown in FIG. 2, the N-channel MOSFET 111 may have a drain connected to one end of the inductor 112, the gate connected to the input terminal 101 through the inductor 102, and a source connected to one end of the inductor 113.

The MOS transistor switch 114 included in the amplifying circuit 104 is provided to block a current of a power supply Vdd during a period in which the wireless communications apparatus 10 does not perform transmission processing and allow the current of the power supply Vdd to flow to the amplifying circuit during a period in which the wireless communications apparatus 10 performs the transmission processing.

The MOS transistor switches 106 and 107 are provided to exclusively switch a function of the wireless communications apparatus 10 between transmission and reception. That is, when the MOS transistor switch 106 is turned on, the MOS transistor switch 107 may be turned off, and when the MOS transistor switch 106 is turned off, the MOS transistor switch 107 may be turned on. When the MOS transistor switch 107 is turned off, a signal from the transmission processing unit 21 may not be transmitted to the antenna 11, and when the MOS transistor switch 107 is turned on, the signal from the transmission processing unit 21 may be transmitted to the antenna 11. The power supplies for switching the MOS transistor switches 106 and 107 on and off may be the same as each other or be different to each other. In the present embodiment, power supplies V1 and V2 are used as the power supplies for switching the MOS transistor switches 106 and 107 on and off, respectively.

The driver circuit 108 may be a circuit controlling voltage for turning the MOS transistor switches 106 and 114 on and off. Each of the MOS transistor switches 106 and 114 may have a gate connected to the same control voltage V1 through the driver circuit 108. The LNA 14 may turn the MOS transistor switches 106 and 114 on and off by changing the control voltage V1.

Herein, the configuration of the LNA 14 included in the wireless communications apparatus 10 according to the embodiment of the present invention has been described with reference to FIG. 2. In addition, in the case in which an MOS transistor switch blocking inflow of a current Idd from the power supply Vdd during the transmission is installed, the configuration of the amplifying circuit 104 is not limited to the example shown in FIG. 2. Next, an operation of the LNA 14 included in the wireless communications apparatus 10 according to the embodiment of the present invention will be described.

Operation of LNA

The wireless communications apparatus 10 according to the embodiment of the present invention may perform communications by time division duplexing. Therefore, the wireless communications apparatus 10 may switch between transmission and reception at a predetermined interval of time.

During transmission, the wireless communications apparatus 10 may change the control voltage V1 so as to turn the MOS transistor switches 106 and 114 off, and change the control voltage V2 so as to turn the MOS transistor switch 107 on. Therefore, the MOS transistor switches 106 and 114 are turned off and the MOS transistor switch 107 is turned on, such that only a transmission system of the wireless communications apparatus 10 may be operated.

Meanwhile, during reception, the wireless communications apparatus 10 may change the control voltage V1 so as to turn the MOS transistor switches 106 and 114 on and change the control voltage V2 so as to turn the MOS transistor switch 107 off. Therefore, the MOS transistor switches 106 and 114 are turned on and the MOS transistor switch 107 is turned off, such that only a reception system of the wireless communications apparatus 10 may be operated.

Here, according to the present embodiment, a voltage of the bias power supply V3 is not changed. Therefore, even in the case in which a turned-on or turned-off state of the MOS transistor switches 106 and 114 is changed by a change in the control voltage V1, a predetermined bias voltage Vin may be continuously applied to the gate of the N-channel MOSFET 111.

Figure 3:
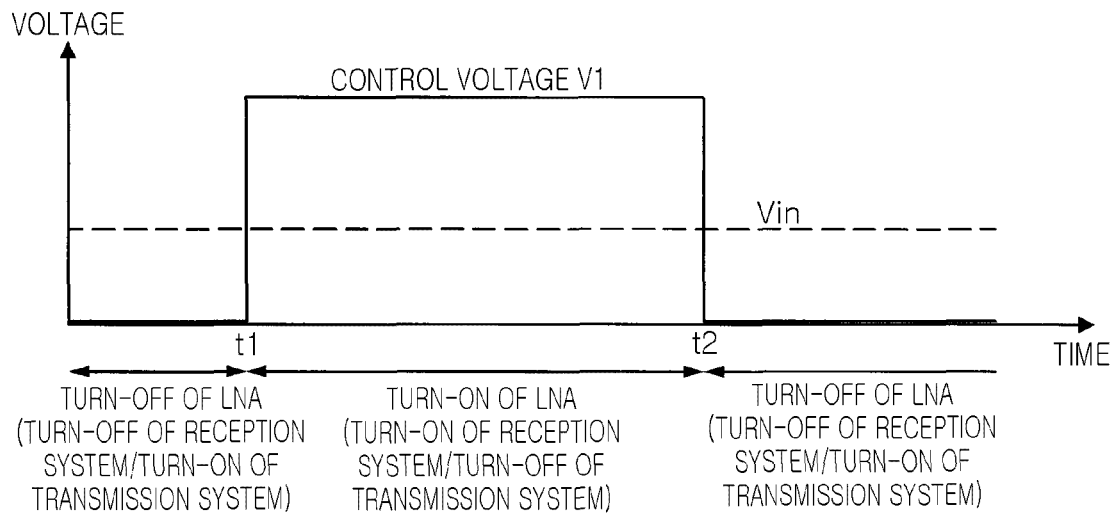
FIG. 3 is a graph showing a state of a control voltage and a bias voltage supplied to a driver circuit.

FIG. 3 is a graph showing a state of the control voltage V1 and the bias voltage Vin supplied to the driver circuit 108. In the graph of FIG. 3, a horizontal axis indicates time and a vertical axis indicates voltage.

Figure 4:
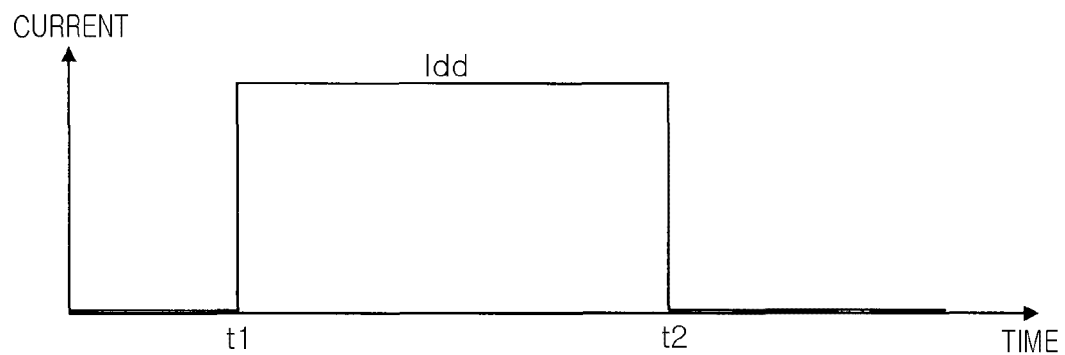
FIG. 4 is a graph showing a change of current flowing in an amplifying circuit.

In addition, FIG. 4 is a graph showing a change of current flowing in the amplifying circuit 104. In the graph of FIG. 4, a horizontal axis indicates time and a vertical axis indicates current.

The control voltage V1 is 0V until a time t1. When the control voltage V1 is 0V, since the MOS transistor switches 106 and 114 are in a turned-off state, the reception system of the wireless communications apparatus 10 may be in a turned-off state. At a time t1, when the control voltage V1 is boosted to a predetermined voltage to turn the MOS transistor switches 106 and 114 on, the reception system of the wireless communications apparatus 10 may be turned on and the current Idd may flow from the power supply Vdd to the amplifying circuit 104.

However, at the time t1, even in the case that a voltage value of the control voltage V1 is changed, the bias voltage Vin is not changed, but is constant.

Then, at a time t2, when the control voltage V1 is changed to 0V, since the MOS transistor switches 106 and 114 are in the turned-off state, the reception system of the wireless communications apparatus 10 may be in the turned-off state. Since the MOS switch transistor 114 is in the turned-off state, the current does not flow from the power supply Vdd to the amplifying circuit 104.

However, at the time t2, even in the case that a voltage value of the control voltage V1 is changed, the bias voltage Vin is not changed, but is constant.

In the wireless communications apparatus 10 according to the embodiment of the present invention, a switch for blocking the current Idd from the power supply Vdd during the transmission of the time division duplexing is not disposed at an input portion of the LNA 14, such that a noise figure (NF) of the LNA 14 is not deteriorated. In addition, since a node of the power supply Vdd which is an output of the LNA 14 has a small time constant, the MOS transistor switch 114 may be turned off in a short switching time.

In addition, the wireless communications apparatus 10 according to the embodiment of the present invention does not need to make the input voltage Vin 0V during the transmission of the time division duplexing and may maintain Vin as a positive voltage. Even during the transmission of the time division duplexing, Vin is maintained as the positive voltage, whereby a gate-source voltage and a gate-drain voltage of the N-channel MOSFET 111 may be maintained as a negative voltage.

The gate-source voltage and the gate-drain voltage of the N-channel MOSFET 111 are maintained as the negative voltage, whereby even in the case that a large signal is flowing in the MOS transistor switch 106 of the reception system during the transmission, good isolation characteristics may be maintained. In other words, the MOS transistor switch 106 of the reception system is in the turned-off state and the gate-source voltage and the gate-drain voltage of the N-channel MOSFET 111 are maintained as negative voltages, such that the transmission signal may not be distorted.

Herein, the operation of the LNA 14 included in the wireless communications apparatus 10 according to the embodiment of the present invention has been described.

Conclusion

As described above, according to the embodiment of the present invention, the MOS transistor switch for switching between transmission and reception is installed at the front end portion of the LNA 14, such that transmission and reception are controlled so as to be exclusively switched. Therefore, the inflow of current to the amplifying circuit 104 may be blocked during transmission while the deterioration of the NF of the LNA 14 is suppressed, and the power consumption thereof may be reduced.

In addition, according to the embodiment of the present invention, a predetermined bias voltage Vin is applied to the gate of the N-channel MOSFET 111 which is an input transistor in the LNA 14. However, during switching between transmission and reception, the bias voltage Vin applied to the gate of the N-channel MOSFET 111 is not changed.

Even during the transmission of the time division duplexing, Vin is maintained as the positive voltage, whereby the gate-source voltage and the gate-drain voltage of the N-channel MOSFET 111 may be maintained as the negative voltage. The gate-source voltage and the gate-drain voltage of the N-channel MOSFET 111 are maintained as the negative voltage, whereby even in the case that a large signal is flowing in the MOS transistor switch 106 of the reception system during transmission, good isolation characteristics may be maintained. That is, the MOS transistor switch 106 of the reception system is in the turned-off state and the gate-source voltage and the gate-drain voltage of the N-channel MOSFET 111 are maintained as negative voltages, such that distortion of the transmission signal may be prevented.

As set forth above, according to embodiments of the present invention, an amplifying circuit capable of being configured to block current from flowing to a CMOS LNA circuit while the CMOS LNA circuit is not operating, without increasing NF, and a wireless communications apparatus including the same may be provided.

While the present invention has been shown and described in connection with the embodiments, it will be apparent to those skilled in the art that modifications and variations can be made without departing from the spirit and scope of the invention as defined by the appended claims.

What is claimed is:

1. An amplifying circuit comprising:
   an input transistor having a gate electrode connected to a signal input terminal inputting a wireless signal received therein, a drain electrode connected to a power supply terminal, and a source electrode connected to a ground terminal;
   a first switch installed between the signal input terminal and the gate electrode of the input transistor; and
   a second switch installed between the power supply terminal and the drain electrode of the input transistor,
   wherein the input transistor has a predetermined bias voltage applied to the gate electrode thereof to simultaneously turn the first and second switches on during reception of the wireless signal and simultaneously turn the first and second switches off while applying the predetermined bias voltage to the gate electrode of the input transistor during transmission of the wireless signal.

2. The amplifying circuit of claim 1, wherein the wireless signal is transceived by time division duplexing.

3. A wireless communications apparatus comprising the amplifying circuit of claim 1.

4. A wireless communications apparatus comprising the amplifying circuit of claim 2.

* * * * *